(12) United States Patent
Chan et al.

(10) Patent No.: US 6,323,559 B1
(45) Date of Patent: Nov. 27, 2001

(54) HEXAGONAL ARRANGEMENTS OF BUMP PADS IN FLIP-CHIP INTEGRATED CIRCUITS

(75) Inventors: Chun Chan, San Jose; Mike Liang, Milpitas, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/103,654

(22) Filed: Jun. 23, 1998

(51) Int. Cl.[7] ........................................ H01L 23/48
(52) U.S. Cl. ............................. 257/778; 257/786
(58) Field of Search ............................. 257/778, 737, 257/738, 786, 776

(56) References Cited

U.S. PATENT DOCUMENTS 5,719,449 * 2/1998 Strauss .

* cited by examiner

Primary Examiner—Carl Whitehead, Jr.
Assistant Examiner—Roy Potter
(74) Attorney, Agent, or Firm—Mitchell, Silberberg & Knupp LLP

(57) ABSTRACT

A flip-chip integrated circuit die includes a semiconductor substrate, electronic components implemented on the semiconductor substrate, several plural metal layers, wires routed between the electronic components on the metal layers, a top layer, and bump pads arranged in a hexagonal array on the top layer. According to another aspect, the invention is directed to flip-chip integrated circuit design, in which a circuit description is input and standardized cells which correspond to electronic components in the circuit description are obtained. The standardized cells are laid out on the surface of the die using a rectangular-based layout technique, and bump pads are laid out in a hexagonal array.

16 Claims, 13 Drawing Sheets

HEXAGONAL ARRANGEMENTS OF BUMP PADS IN FLIP-CHIP INTEGRATED CIRCUITS

BACKGROUND OF THE INVENTION

1. Field of the Invention

The present invention concerns the design of flip-chip integrated circuits (ICs), and particularly relates to hexagonal arrangements of bump pads in a flip-chip IC.

2. Description of the Related Art

In recent years, manufacture of flip-chip integrated circuits (ICs) has become common. One example of a flip-chip configuration is shown in FIG. 1, which shows a cross-sectional view of a flip-chip 100. Referring to FIG. 1, flip-chip 100 includes a number of layers separated from each other by electrically insulating (typically oxide) layers 105. The transistors, resistors and other electronic devices, as well as some of the electrical connections between such electronic devices, are formed on semiconductor (typically polysilicon) layer 102. However, metal layers 104a to 104d are used for providing the bulk of the electrical connections between the electronic devices formed on semiconductor substrate 102. By providing such metal layers, valuable space on the semiconductor layer can be conserved for forming electronic devices.

Flip-chip 100 also includes a top layer 106, on which are formed multiple solder bump terminals 108, called bump pads, which are used as the input/output terminals for die 100. For mounting purposes, flip-chip die 100 is "flipped" so that top layer 106 faces downward. Top layer 106 then is bonded to a substrate which may be a passive carrier, such as a printed circuit board, or may be another semiconductor chip. Specifically, each bump pad 108 typically is solder bonded to a corresponding pad on the substrate, thereby forming the required electrical connections. The substrate then is usually bonded directly to a printed circuit board, on which additional flip-chips and/or ICs utilizing other types of packaging are mounted.

Flip-chip integrated circuits ordinarily are designed in a multi-phase process. The physical design phase of the design process involves deriving information for fabricating the integrated circuit, based on an input circuit description called a netlist. Two of the most difficult problems in physical design are layout and routing. Layout is the step of locating a physical position on the surface of the semiconductor layer for each of the electronic components specified in the netlist. Routing is the step of mapping out electrically conductive traces, or wires, between the electronic components, also according to the netlist. These two problems are interrelated in that a good layout often will greatly simplify the routing step and a poor layout may render routing unfeasible. Because a typical IC can contain hundreds of thousands or millions of electronic components, a designer usually relies heavily on computer-aided design tools to perform layout and routing.

Frequently, flip-chips such as flipchip 100 utilize rectangular-based layout and routing. An example of a particular rectangular-based layout is illustrated in FIG. 2 which provides a representational illustration of die 100. The logic circuitry of integrated circuit 100 is formed in the interior portion 120 of the semiconductor layer 102, while the periphery of semiconductor layer 102 is used for the I/O devices 116. The logic portion 120 includes a number of functional circuit blocks, which can have different sizes and shapes and which are laid out based on a rectangular grid. The larger blocks include central processing unit (CPU) 121, read-only memory (ROM) 122, clock/timing unit 123, random access memories (RAMs) 124, and I/O unit 125 for providing an interface between CPU 121 and various peripheral devices. These blocks, commonly known as macroblocks, can be considered as modules for use in various circuit designs, and are represented as standard designs in circuit libraries. The logic portion also includes tens of thousands, hundreds of thousands or even millions or additional small cells 126. Each cell 126 represents either a single logic element, such as a gate, or several logic elements interconnected in a standardized manner to perform a specific function. Cells that consist of two or more interconnected gates or logic elements are also available as standard modules in circuit libraries.

All of the small cells 126 and macroblocks 121–125 shown in FIG. 2 are laid out on semiconductor substrate 102 according to a fixed rectangular grid pattern. That is, each cell 126 occupies a single grid slot and each of macroblocks 121–125 occupies an integral number of grid slots. However, it should be noted that many conventional rectangular-based techniques, and rectangular-grid-based techniques in particular, permit deviations from the rectangular grid pattern in certain cases, such as for non-standard sized cells.

Another example of a conventional rectangular-based layout is illustrated in FIG. 3. The layout of FIG. 3 often is preferable when, because many non-standard-sized cells are to be used, it would be impractical to align the cells in both x and y coordinates using grid-based layout. This approach therefore utilizes multiple cell columns 140, each including a column of cells 145, each cell having a standard width but potentially different lengths. Thus, while in the grid-based layout approach cells generally are aligned with certain established (x,y) coordinates, in the cell-column approach generally are aligned only with respect to the x coordinate. Similar to rectangular-grid-based placement, the cell-column approach also permits occasional deviations from a strict rectangular layout. For instance, larger cells or macroblocks, such as macroblock 147, may span more than a single cell column.

For each cell column 140, one of the metal layers, typically the first metal layer, includes a power rail 141 and a ground rail 142. The cells 145 connect to the power rail 141 and ground rail 142 using interlayer connections called vias. In the example shown in FIG. 3, macroblock 147 is provided with an external power ring 148 and external ground ring 149 for routing power rails 141 and ground rails 142 around the macroblock.

In either of the foregoing techniques, wire routing between the cells also is rectangular-based, i.e., primarily utilizes horizontal and vertical trace extensions. As noted above, most of the wire routing is done in the IC's metal layers. An example of such rectangular-based routing is illustrated in FIG. 4. One typical wire connection in FIG. 4 is wire 170, which is routed between cell 160 and cell 162. Wire 170 includes horizontal portion 170a, vertical portion 170b and horizontal portion 170c. Similarly, each of the other wires shown in FIG. 4 interconnecting the cells 160–166 includes only vertical and horizontal segments. However, similar to rectangular-based layout, in certain cases wire traces which are not purely horizontal or purely vertical sometimes are used in rectangular-based routing.

Rectangular-based layout and routing provides a structured framework in which to approach the physical design problem. This is particularly important when using automated software tools, which function according to a fixed set of pre-defined rules. For example, in rectangular-based layout the CAD layout tool can simply leave channels between columns or rows of cells based on anticipated routing needs. An advantage of using rectangular-based routing is that such a technique often is relatively easy to implement in a manner which avoids unwanted wire crossings.

In this latter regard, rectangular-based routing frequently is implemented by routing the majority of the vertical wire segments in one metal layer (such as metal layer 1) and the majority of the horizontal wire segments in a different metal layer (such as metal layer 2). This is illustrated in FIGS. 5A and 5B. In particular, FIG. 5A illustrates metal layer 1 on which the vertical wire segments shown in FIG. 4 are routed and FIG. 5B illustrates metal layer 2 on which the horizontal wire segments shown in FIG. 4 are routed. The horizontal and vertical segments for a particular wire are connected to each other using via 175. Similarly, connections between wires on the metal layers and the cells on the semiconductor layer are made using vias. In certain specific cases, exceptions are sometimes made and vertical segments are routed on a horizontal metal layer or horizontal segments are routed on a vertical metal layer. However, by routing mainly horizontal segments on one layer and mainly vertical segments on a different layer, the risk of an inadvertent wire crossing, or conversely, the planning required to avoid such a wire crossing, is usually minimized.

Thus, rectangular-based placement and routing often can greatly simplify the physical design process. As noted above, this is particularly important because many flip-chip integrated circuits contain hundreds of thousands or millions of cells which must be laid out, and for which interconnecting wires must be routed.

In correspondence with component layout and wire routing, in the conventional flip-chip design, layout of bump pads 108 also is rectangular-based. Specifically, in conventional layout bump pads are usually arranged in a rectangular array. FIG. 6 illustrates a conventional rectangular array of bump pads 108. In particular, FIG. 6 shows a certain bump pad 108a and its nearest neighbors 108b through 108e. Connecting the midpoint of each bump pad 108 to its nearest neighbors in the conventional rectangular-based arrangement results in a pattern of non-overlapping rectangles 190. The conventional bump pad arrangement depicted in FIG. 6 therefore is referred to herein as a rectangular array. Ordinarily, the center-to-center distances between bump pad and its nearest neighbors are fixed at a constant value based on fabrication requirements. Accordingly, each of the rectangles 190 typically is square.

It is noted that in actual implementation some of the positions indicated in FIG. 6 as containing a bump pad actually are left open. This frequently is the case, for example, with bump pad positions near the center of the die. Sometimes it is difficult to route wires from certain of these bump pad positions to the outer edges of the die, and therefore they are left empty, in a process known as de-populating.

An advantage of flip-chip integrated circuits over wire bond ICs is the ability of flip-chips to provide more pads for inputting and outputting external signals. In particular, with flip-chip ICs pads can be implemented across the entire surface of the die, rather than solely at the die's periphery. As technology advances even further, however, the demand continues to increase for even more bump pads than can be provided by conventional flip-chip techniques.

SUMMARY OF THE INVENTION

The present invention addresses the foregoing problem by providing a flip-chip having a hexagonal array of bump pads, even though layout and/or routing may be rectangular-based.

In one aspect the invention is directed to a flip-chip integrated circuit die that includes a semiconductor substrate, electronic components implemented on the semiconductor substrate, several plural metal layers, wires routed between the electronic components on the metal layers, a top layer, and bump pads arranged in a hexagonal array on the top layer.

According to another aspect, the invention is directed to flip-chip integrated circuit design, in which a circuit description is input and standardized cells which correspond to electronic components in the circuit description are obtained. The standardized cells are laid out on the surface of the die using a rectangular-based layout technique, and bump pads are laid out in a hexagonal array.

As result of the foregoing arrangements, the present invention often can provide more bump pads for a given sized die than conventional arrangements would permit. Moreover, in a more particularized aspect of the invention, a hexagonal flip-chip array is used in conjunction with rectangular-based cell layout and wire routing. In another particularized aspect, a hexagonal flip-chip array is used in conjunction with wires routed horizontally and vertically. By virtue of the foregoing particularized aspects of the invention, advantages of conventional cell layout and wire routing generally can be maintained while still increasing the overall number of bump pads.

According to a further aspect of the invention, bump pads are arranged in a repeating geometrical pattern of identically shaped groups. This aspect of the invention permits a designer relatively easily to obtain desired I/O signal:power:ground ratios. According to a still further aspect, lines of bump pads supply core logic power and core logic ground to the die. By virtue of these aspects of the invention, a hexagonal array of bump pads can be made compatible with conventional cell layout techniques, such as a cell column technique. Thus, each of the foregoing particularized aspects of the invention provides a practical implementation of a hexagonal bump pad array.

The foregoing summary is intended merely to provide a brief description of the general nature of the invention. A more complete understanding of the invention can be obtained by referring to the claims and the following detailed description of the preferred embodiments in connection with the accompanying figures.

DETAILED DESCRIPTION OF THE PREFERRED EMBODIMENTS

First Embodiment

Figure 1:
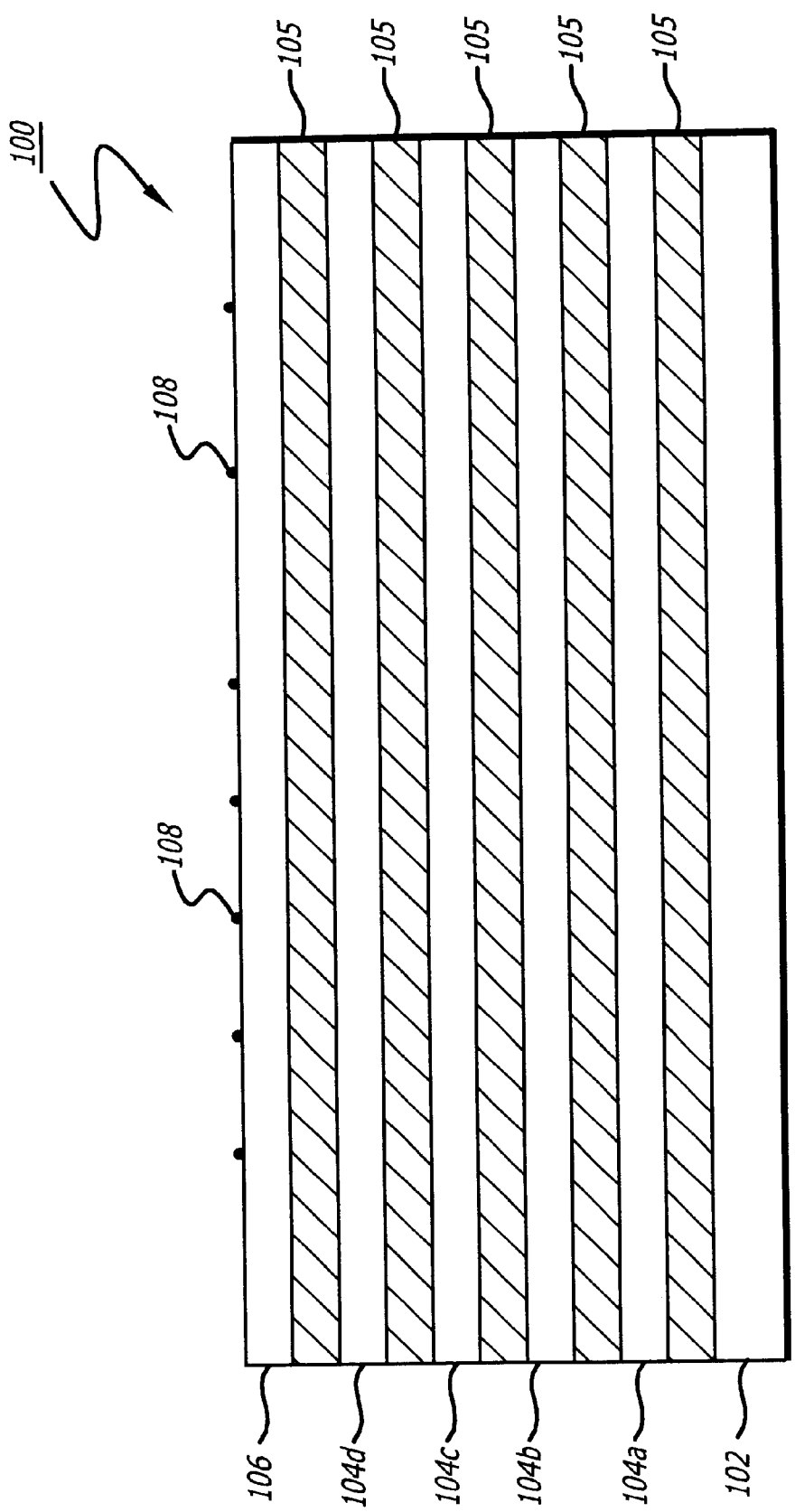
FIG. 1 illustrates a cross-sectional view of a typical flip-chip integrated circuit.
Figure 2:
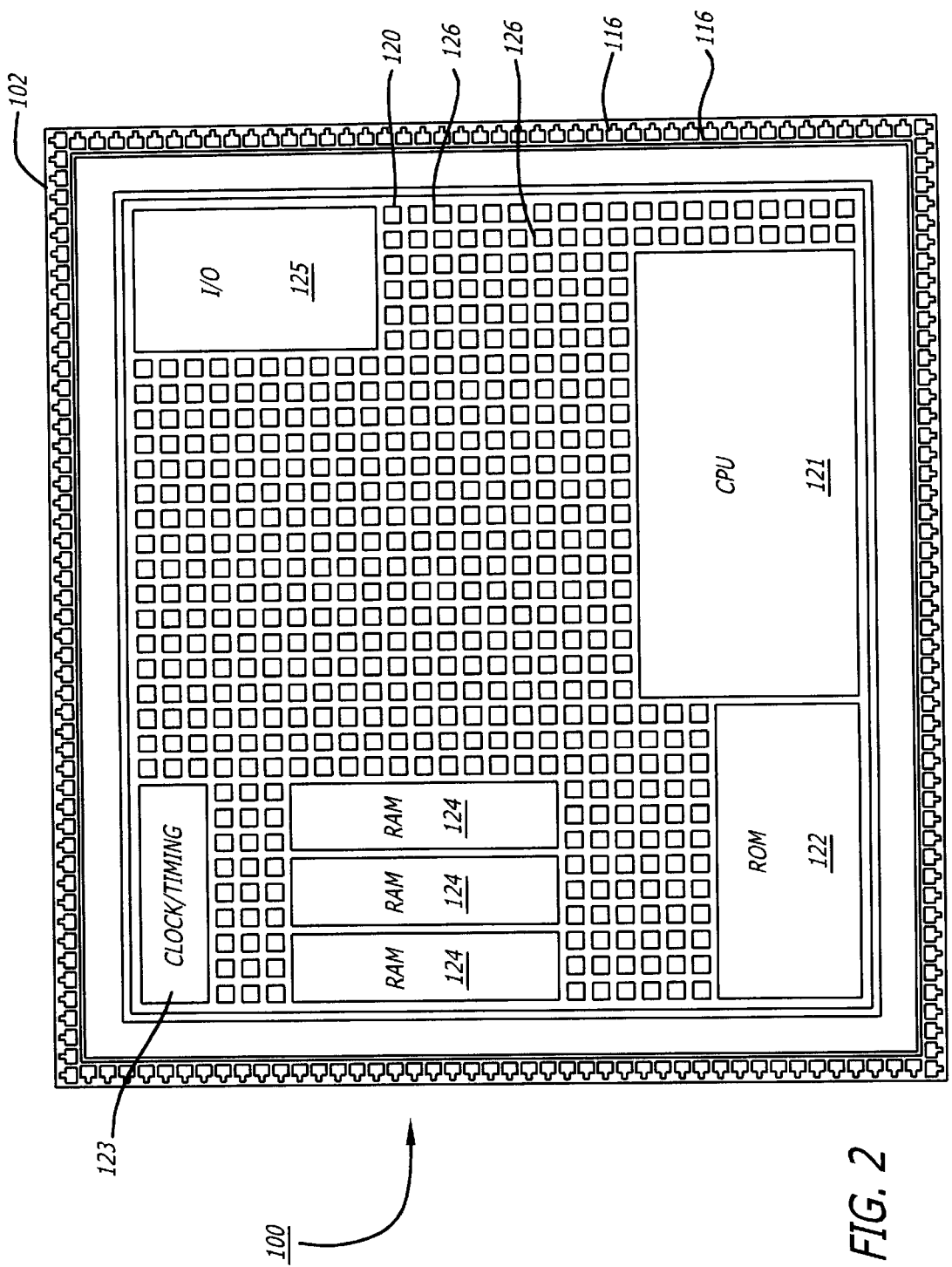
FIG. 2 is a representational view of the semiconductor layer for a flip-chip integrated circuit utilizing rectangular-grid based layout.
Figure 3:
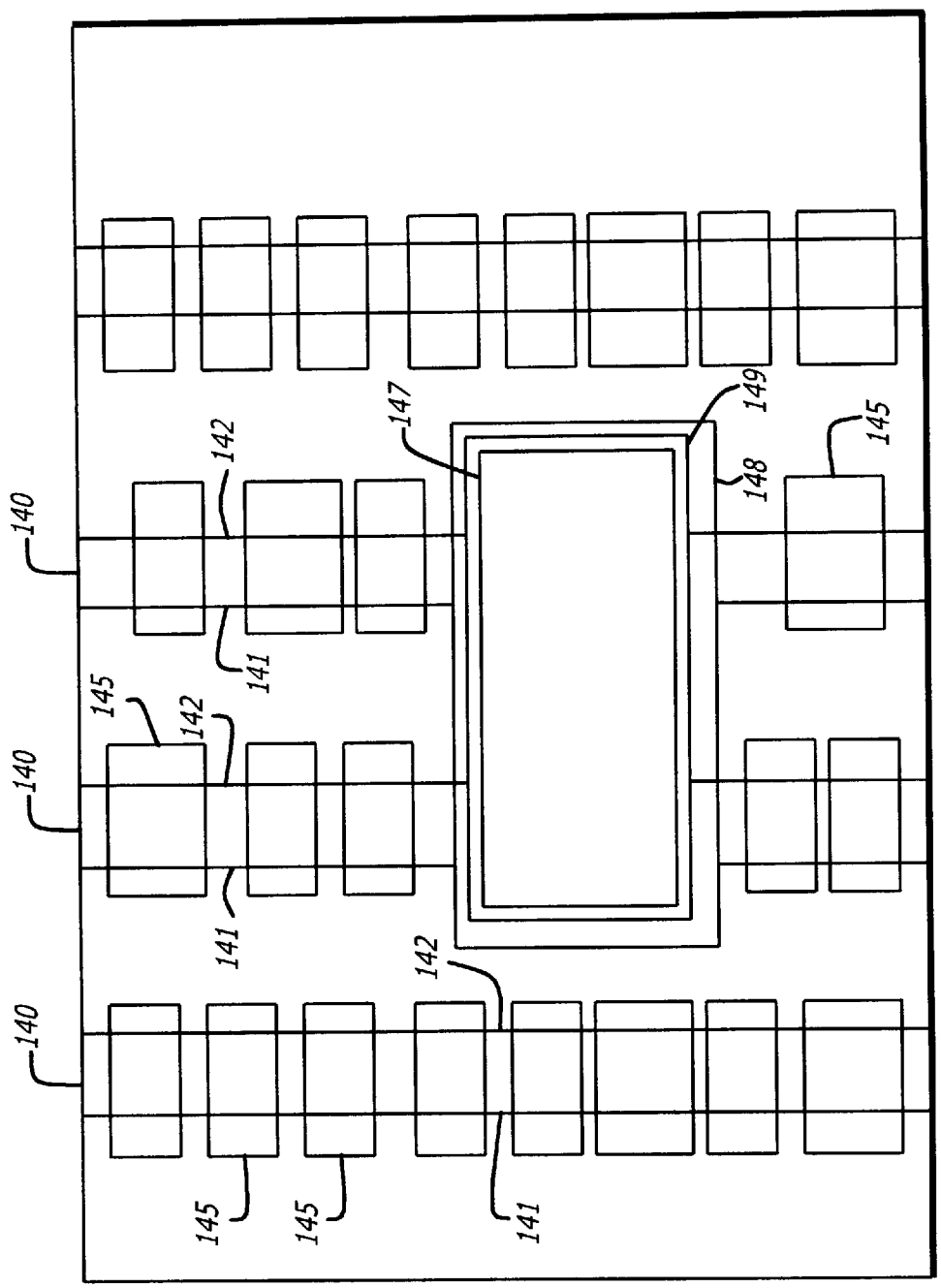
FIG. 3 is a representational view of the semiconductor layer for a flip-chip integrated circuit utilizing cell-column layout.
Figure 4:
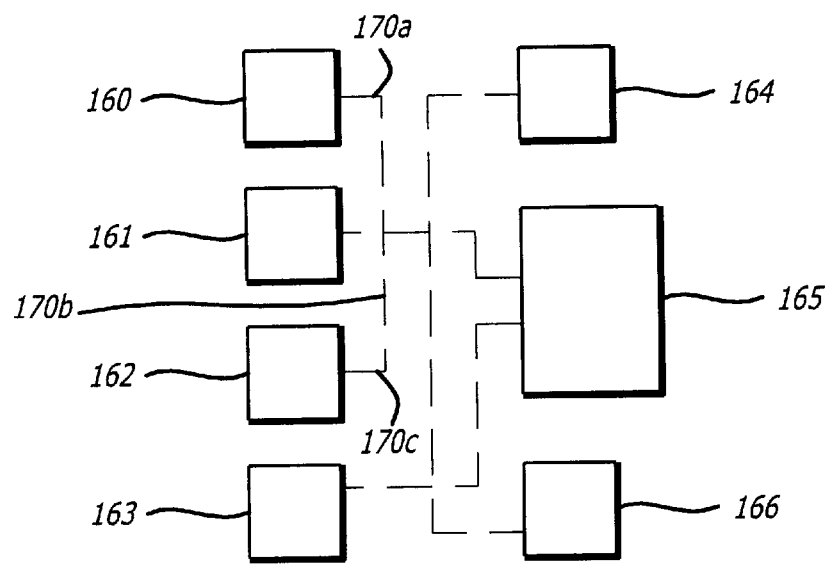
FIG. 4 illustrates rectangular-based routing in flip-chip integrated circuit design.
Figure 5A:
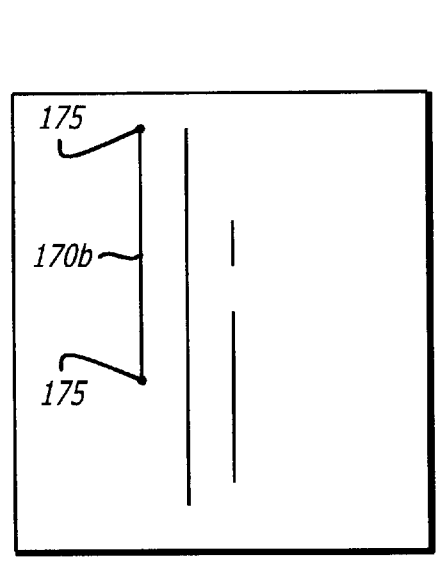
FIGS. 5A and 5B illustrate a vertical metal layer and a horizontal metal layer, respectively for the wire routing shown in FIG. 4.
Figure 5B:
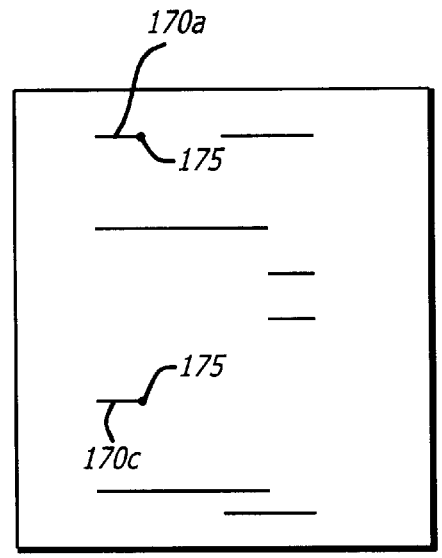
Figure 6:
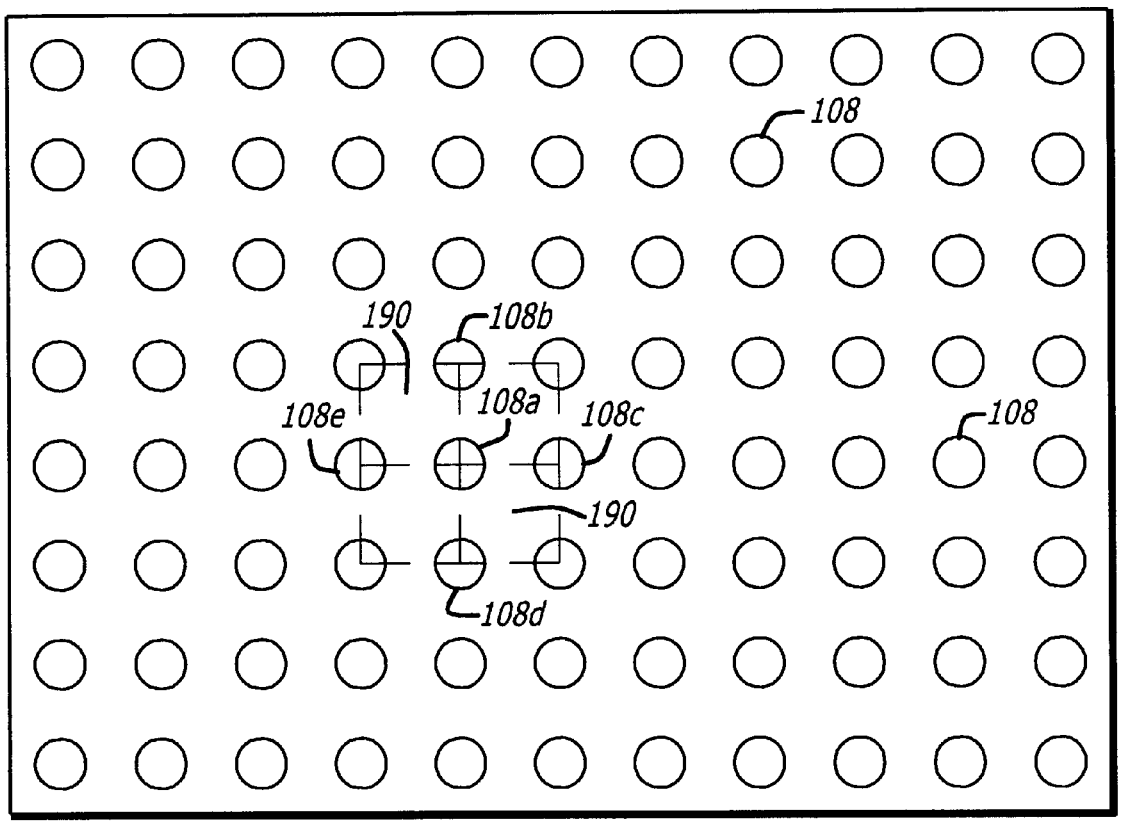
FIG. 6 illustrates a conventional rectangular array layout of bump pads.
Figure 7:
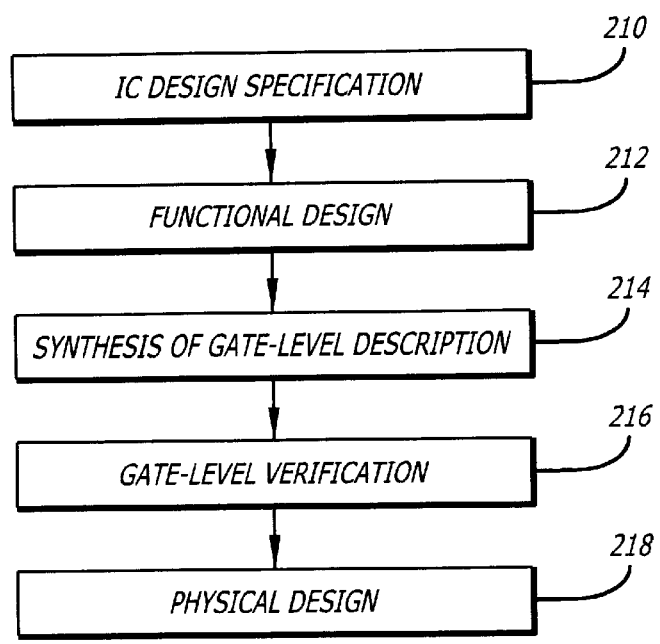
FIG. 7 is a flow diagram for explaining flip-chip integrated circuit design according to a representative embodiment of the invention.

FIG. 7 illustrates a flow diagram for providing a brief overview of flip-chip IC design according to a representative embodiment of the invention. Briefly, according to FIG. 7, an IC design specification is prepared; a functional description of a system corresponding to the design specification is produced; a gate-level circuit description is synthesized from the functional description; a simulation is performed to verify the feasibility of the gate-level description; and physical design is performed.

In more detail, in step 210 an IC design specification is prepared. At this initial step of the design cycle, the desired system design is described in the highest level of abstraction. Subsequent steps in the design cycle provide successively more detail until all information required to fabricate the chip has been derived. Preferably, the design specification dictates features such as performance criteria, required external interfaces and protocols, and product cost targets.

In step 212, a functional design is produced. Specifically, the functional design describes a system that will satisfy the IC design specification prepared in step 210. Preferably, the functional design is written using a highly structured syntax so as to permit subsequent steps in the design cycle to be performed using automated computer-aided design (CAD) tools. More preferably, the functional design is written in a hardware description language (HDL) such as VHDL (IEEE standard 1076-1993) or Verilog-HDL.

In step 214, a description of a gate-level circuit is synthesized based on the HDL code produced in step 212. Preferably, gate-level design is performed by running an automated synthesis tool on the HDL code. Upon execution of the synthesis tool, physically realizable gates and flip-flops are selected from a pre-defined library and are interconnected in a manner so as to satisfy the relationships and to perform the processing defined by the HDL code. Processing by the synthesis tool preferably utilizes pre-defined user design constraints which have been formulated in an effort to enhance the feasibility of the design, particularly with respect to problems which might otherwise not be discovered until later in the design cycle. The format of the gate-level circuit description synthesized in step 214 is a "netlist", which categorizes a number of "nets", each including one or more gates and/or flip-flops, and which also describes the interconnections between these nets.

In gate-level verification step 216, a computer simulation is run to test the circuit design synthesized during gate-level design step 214. The goals of this simulation are to determine whether all performance criteria have been met and whether any timing or other circuit errors will occur in response to a variety of different input signals and conditions. Upon completion of gate-level verification is step 216, the netlist is provided to physical design step 218. In addition, a dump of top-level signals contained in the netlist is provided to the user for the user to designate the positions in which I/O devices corresponding to these signals will be implemented on the chip and to designate which bump pads will be connected to these I/O devices, as described in more detail below.

In physical design step 218, the netlist generated in step 216 is mapped to information for physically implementing the corresponding circuit on an IC die. The objective of physical design is to determine an optimal arrangement of devices in a plane or in a three-dimensional space, and an efficient interconnection or routing scheme between the devices to obtain the desired functionality. One goal of physical design step 218 is to implement the design using minimum chip area. Other factors considered during physical design include thermal generation, electromagnetic effects and the number of metal layers available for wire routing.

Step 218 produces a set of design files in an unambiguous representation known as an intermediate form that describes the layout. The design files are then converted into pattern generator files that are used to produce patterns called masks by an optical or electron beam pattern generator. The preferred implementation of physical design step 218 is discussed below in more detail in connection with FIG. 8.

It should be noted that while the foregoing design cycle is preferred, variations of the foregoing may also be used, as will be apparent to those skilled in the art. In addition, although the foregoing design process is described above and shown in FIG. 7 as being purely sequential, many times one or more of the steps will need to be repeated. That is, if the design is found to be unfeasible at one step, an earlier step might need to be re-executed to correct the problem. For example, it might occur that in step 214 a gate-level description can not be generated to satisfy the functional design requirements using the available technology library, while at the same time maintaining the user's design constraints. In this case, the functional description may need to be redesigned in step 212 in order to achieve a feasible design.

Figure 8:
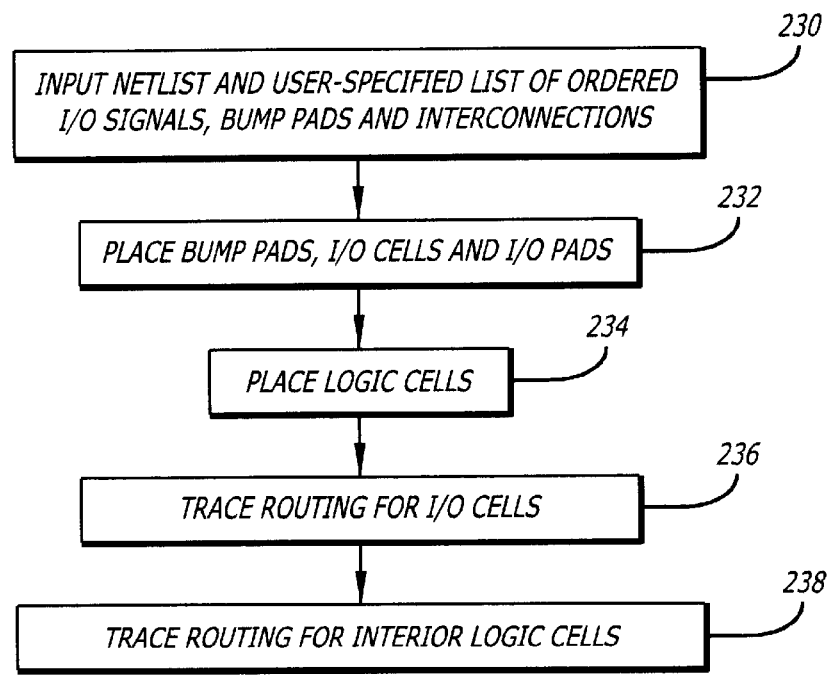
FIG. 8 is a flow diagram for explaining physical design according to a representative embodiment of the invention.

A more detailed discussion of physical design step 218 (shown in FIG. 7) in the preferred embodiment of the invention will now be discussed with reference to the flow diagram shown in FIG. 8. Briefly, according to FIG. 8, (i) the netlist and a list of ordered I/O signals, bump pads and interconnections are input (ii) bump pads, I/O cells and I/O pads are placed; (iii) interior logic cells are placed; (iv) traces are routed between the bump pads, on the one hand, and power rings, ground rings and I/O device pads, on the other; and (v) traces are routed between the interior logic cells and from interior logic the cells to the power and ground rings based on the connections specified in the netlist. Preferably, much of this work is performed using computer-aided design (CAD) tools.

In more detail, in step 230 the netlist is input from gate-level description verification step 216. As noted above, a dump of top-level signals contained in the netlist also has been provided to the user. In the preferred embodiment, the user specifies the positions for I/O devices corresponding to those signals, and in particular, specifies the order in which those I/O devices are to be placed around the periphery of the die. The user also specifies bump pads to be used and designates to which I/O device, power or ground ring each such bump pad is to be connected.

Figure 9:
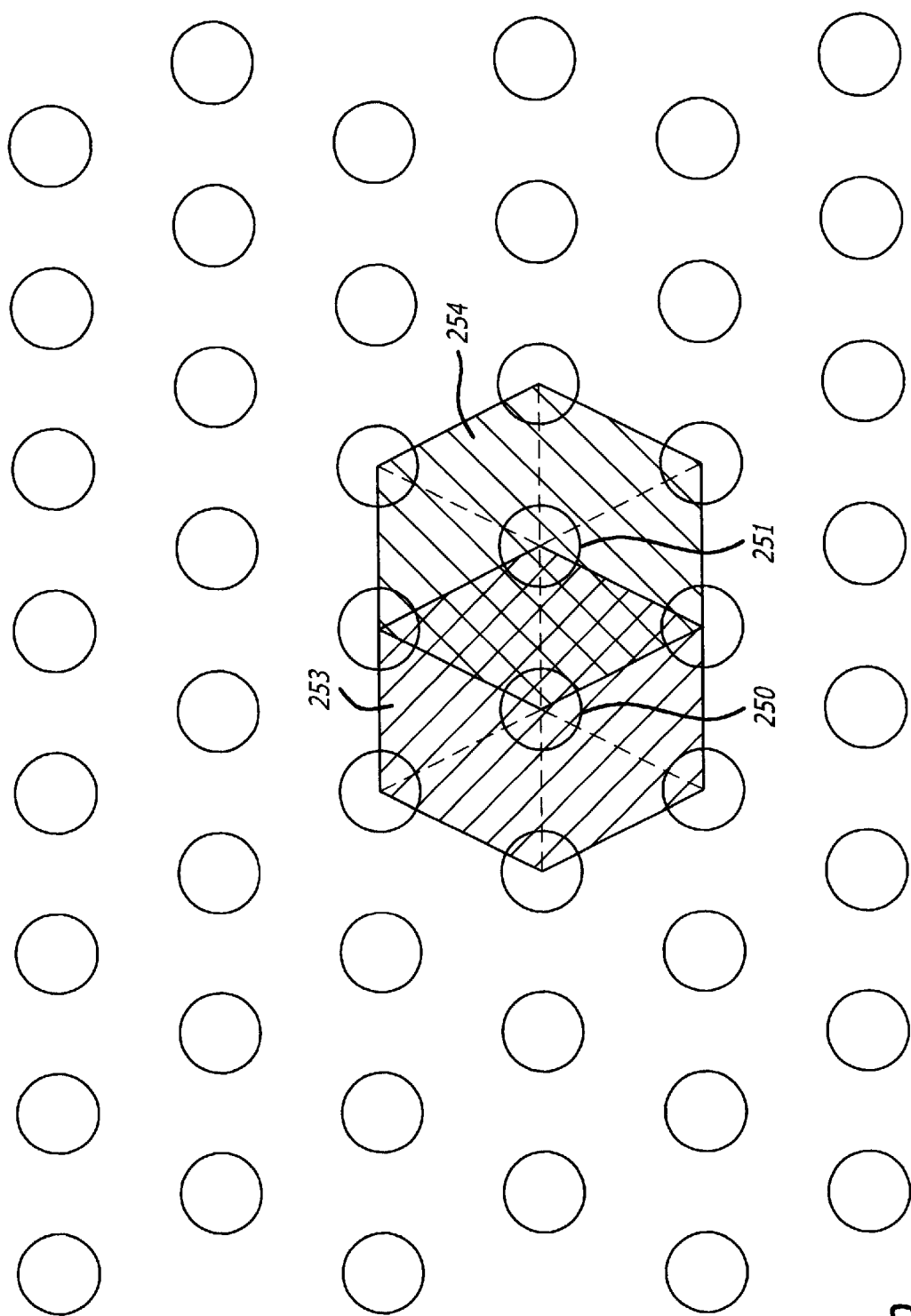
FIG. 9 illustrates a hexagonal array of bump pads according the invention.

In this latter regard, the possible bump pad positions in this embodiment of the invention are arranged in a hexagonal array, an example of which is depicted in FIG. 9. In a hexagonal array of bump pads, connecting the midpoint of the bump pads to their nearest neighbors results in a pattern of overlapping hexagons. For example, referring to FIG. 9, connecting the midpoints of bump pad 250 and bump pad 251 to their respective nearest neighbors results in overlapping hexagons 253 and 254. Preferably, the distance between each bump pad and each of its nearest neighbors is fixed at a constant distance based on the minimum spacing required for fabrication. In this case, it can be shown that, for a given area and a given minimum center-to-center spacing, the total number of available bump pad positions is greater for a hexagonal array than for a rectangular array.

Figure 10:
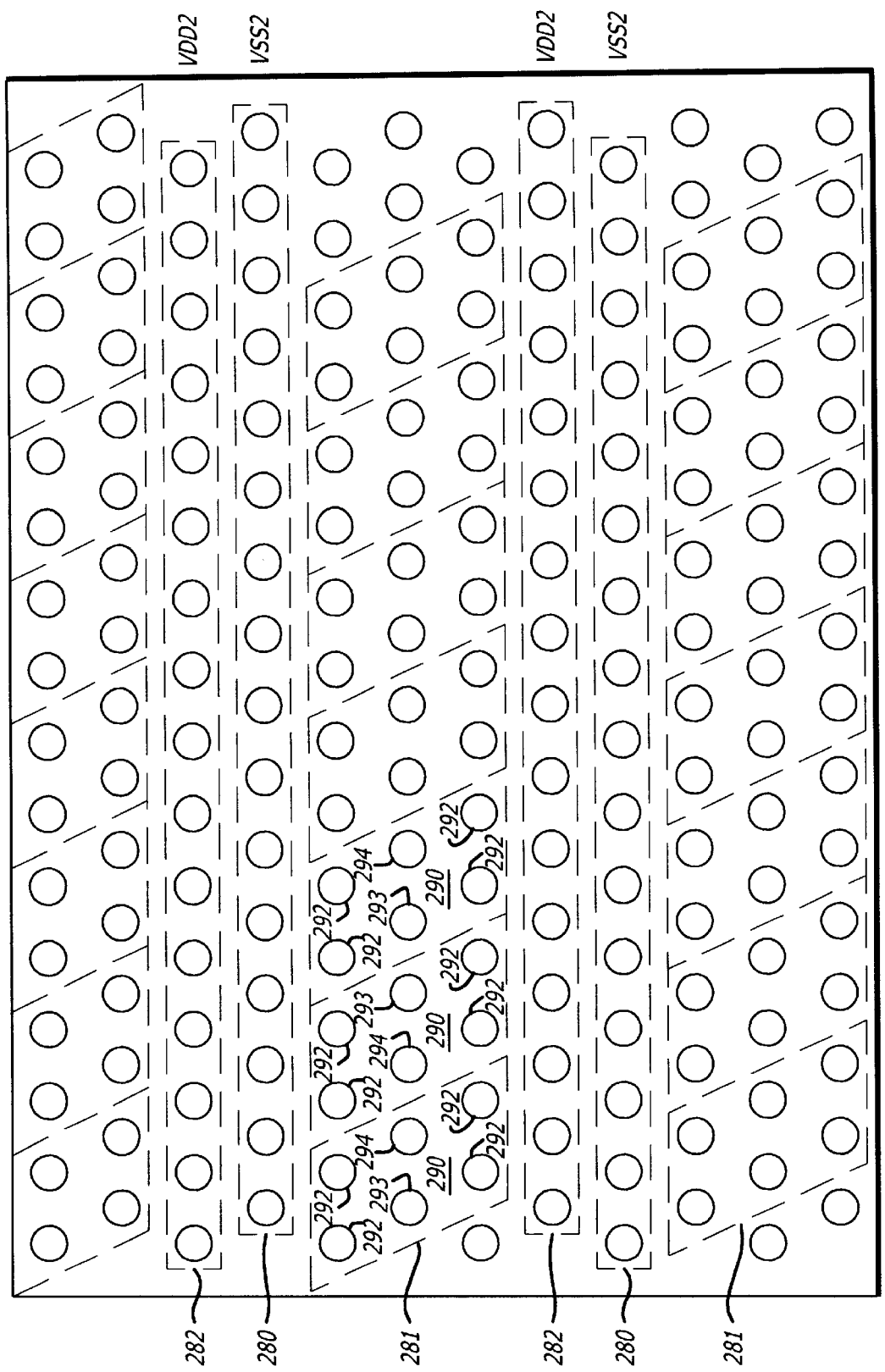
FIG. 10 illustrates a bump pad pattern according to the first embodiment of the invention.

In the current embodiment, the user designates bump pads according to the pattern depicted in FIG. 10. As shown in FIG. 10, bump pads in this embodiment are designated in the following pattern: a row 280 of internal logic ground (VSS2) bump pads, followed by a row 281 of horizontally repeating groups 290 of bump pads, followed by a row 282 of internal logic power (VDD2) bump pads. In this embodiment, each group 290 of bump pads is shaped as a parallelogram and includes four I/O bump pads 292, one I/O power (VDD) bump pad 293 and one I/O ground (VSS) bump pad 294. Also in this embodiment, the I/O bump pads 292 have the same position in each group 290, but the VDD bump pads 293 and VSS bump pads 294 switch positions with each other in successive horizontally adjacent groups.

The bump pad arrangement shown in FIG. 10 thus provides an I/O signal:VDD:VSS:VDD2:VSS2 ratio of 4:1:1:1:1. Other embodiments described below provide different ratios. The arrangement used for a particular design therefore can be selected based at least in part on the desired I/O signal:VDD:VSS:VDD2:VSS2 ratio. Preferably, the pattern of a row of VSS2 bump pads, a row of groups of I/O signal and VDDNSS bump pads, and a row of VDD2 bump pads is repeated vertically. More preferably, this pattern is repeated over the entire surface of the die. This vertically repeating arrangement is particularly preferable when I/O cells are dispersed across the surface of the die.

Moreover, in this embodiment the bump pads can be oriented so that the repeating parallel rows of VSS2/VDD2 bump pads run parallel to the VSS2/VDD2 rails in a cell-column layout, thereby shortening the wire routing requirements from such bump pads. Finally, it should be noted that, as in conventional bump pad layout, bump pads in the arrangement according to this embodiment also may be de-populated in certain circumstances.

Returning to FIG. 8, in step 232 bump pads, I/O cells and I/O pads are laid out (or placed) on the semiconductor layer of the die. Specifically, bump pad (x,y) coordinates are assigned based on both the predefined bump pad hexagonal array and the input user-specified bump pad positions within the array. Also in this step, each I/O device (or cell) also is placed, together with its pads, around the periphery of the die. Placement of I/O cells and pads involves first obtaining from a library information defining a cell for each I/O signal in the user-supplied ordered list. The cell information includes the physical dimensions of the cell and information regarding the number, sizes and relative positions of any pads required for the corresponding I/O cell. Preferably, the device pad is located within a pad space which is vertically adjacent to the I/O device, with the center of the pad being coincident with the physical location within the I/O device of the I/O terminal. In the preferred embodiment, each I/O cell and each pad is rectangular in shape, and therefore the dimensions and relative positions of the I/O cell and pad are specified in the library as a lower-left and an upper-right corner for each, expressed in a relative coordinate system. Upon placement, these relative coordinates are mapped to absolute (x,y) coordinates, referenced from the lower-left corner of the chip edge on which the I/O device is located. In the preferred embodiment, this step is performed using an automated placement tool.

In step 234, the logic cells are placed at the interior of the die. Preferably, placement is rectangular-based, as described above. A main concern in performing this placement is to reduce spacing between cells, thereby minimizing the amount of wire routing that will need to be performed. The main sub-steps in performing step 234 are partitioning, floorplanning and layout.

A chip may contain several million transistors. Layout of the entire circuit generally cannot be handled due to the limitation of memory space as well as the computation power available. Therefore, the circuit is partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is preferably hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement are concerned with selecting good layout alternatives for each block of the entire chip, as well as between blocks and to the edges Floor planning is a critical step as it sets up the ground work for a good layout. During placement, the blocks are exactly positioned on the chip. The goal of placement is to find a minimum area arrangement for the blocks that allows completion of interconnections between the blocks. Placement typically is done in two phases. In the first phase, an initial placement is created. In the second phase, the initial placement is evaluated and iterative improvements are made until the layout has minimum area and conforms to design specifications.

In step 236, bump pad traces are routed to the I/O cells and the I/O cell power/ground rings. Preferably, this trace routing is rectangular-based, as described above. Specifically, locations for the bump pads and I/O devices have already been established. As noted above, bump pads can only be placed in a finite number of pre-defined discrete locations on a hexagonal array. Preferably, the I/O devices also are limited to discrete slots. Accordingly, the trace descriptions can be obtained from a library of pre-stored trace descriptions by indexing into the library using the two locations.

In step 238, traces are routed from the interior logic cells to other logic cells, to the interior logic power and ground rings, and to the I/O cells. Preferably, this trace routing also is rectangular-based, as described above. The objective of logic routing is to complete the interconnections between blocks according to the specified netlist. First, the space not occupied by blocks, which is called the routing space, is partitioned into rectangular regions called channels and switch boxes. The goal of the router is to complete all circuit connections using the shortest possible wire length and using only the channel and switch boxes.

Routing in this step is preferably done in two phases, referred to as the global routing and detailed routing phases.

In global routing, connections are completed between the proper blocks of the circuit, disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Second Embodiment

Figure 11:
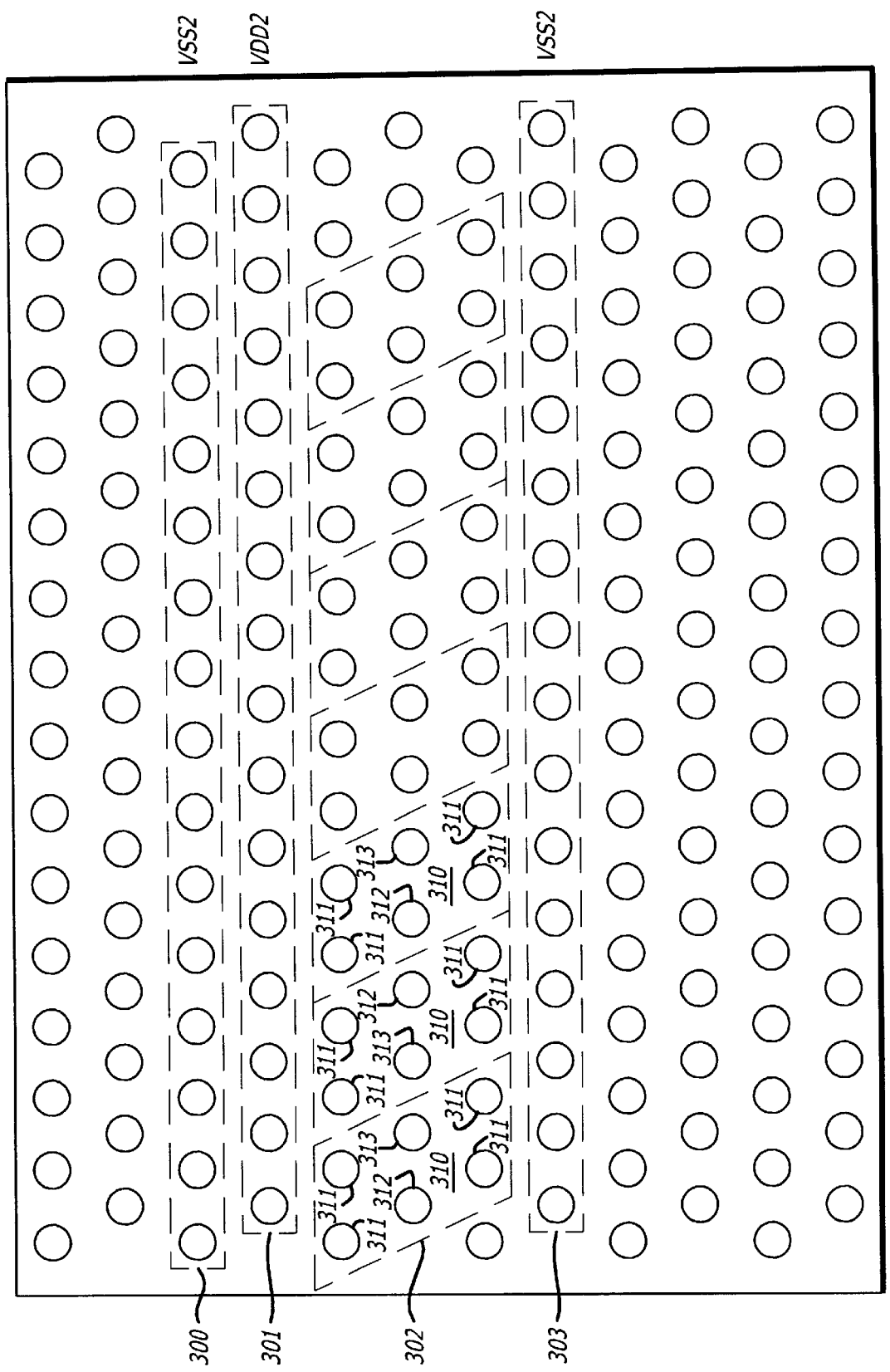
FIG. 11 illustrates a bump pad pattern according to the second embodiment of the invention.

The second embodiment of the invention is identical to the first except that in step 230 (shown in FIG. 8) the user designates the bump pads according to the pattern shown in FIG. 11. The arrangement shown in FIG. 11 is similar to that of the first embodiment, except that an additional row of VSS2 bump pads has been added. Specifically, the arrangement in this embodiment is characterized as follows: a row 300 of VSS2 bump pads, followed by a row 301 of VDD2 bump pads, followed by a row 302 of horizontally repeating groups 310 of bump pads, followed by a row 303 of VSS2 bump pads. Each group 310 of bump pads is shaped as a parallelogram and includes four I/O bump pads 311, one VDD bump pad 312 and one VSS bump pad 313. Accordingly, an I/O signal:VDD:VSS:VDD2:VSS2 ratio of 4:1:1:2:2 is provided by this arrangement. Although not shown in FIG. 11, similar to the first embodiment, it is preferable that the pattern depicted in FIG. 11 repeat vertically and more preferable that the pattern repeat across the entire surface of the die.

Also similar to the first embodiment, the possible bump pad positions are arranged in a hexagonal array, and preferably, the distance between each bump pad and each of its nearest neighbors is fixed at a constant distance based on the minimum required for fabrication. As seen in FIG. 11, in this embodiment, the I/O bump pads have the same position in each group 310, but the VDD bump pads 312 and VSS bump pads 313 switch positions with each other in successive horizontally adjacent groups. The bump pads can be oriented in this embodiment so that the repeating parallel rows of VSS2/VDD2 bump pads run parallel to the VSS2/VDD2 rails in a cell-column layout, and bump pads in this embodiment also may be de-populated.

Third Embodiment

Figure 12:
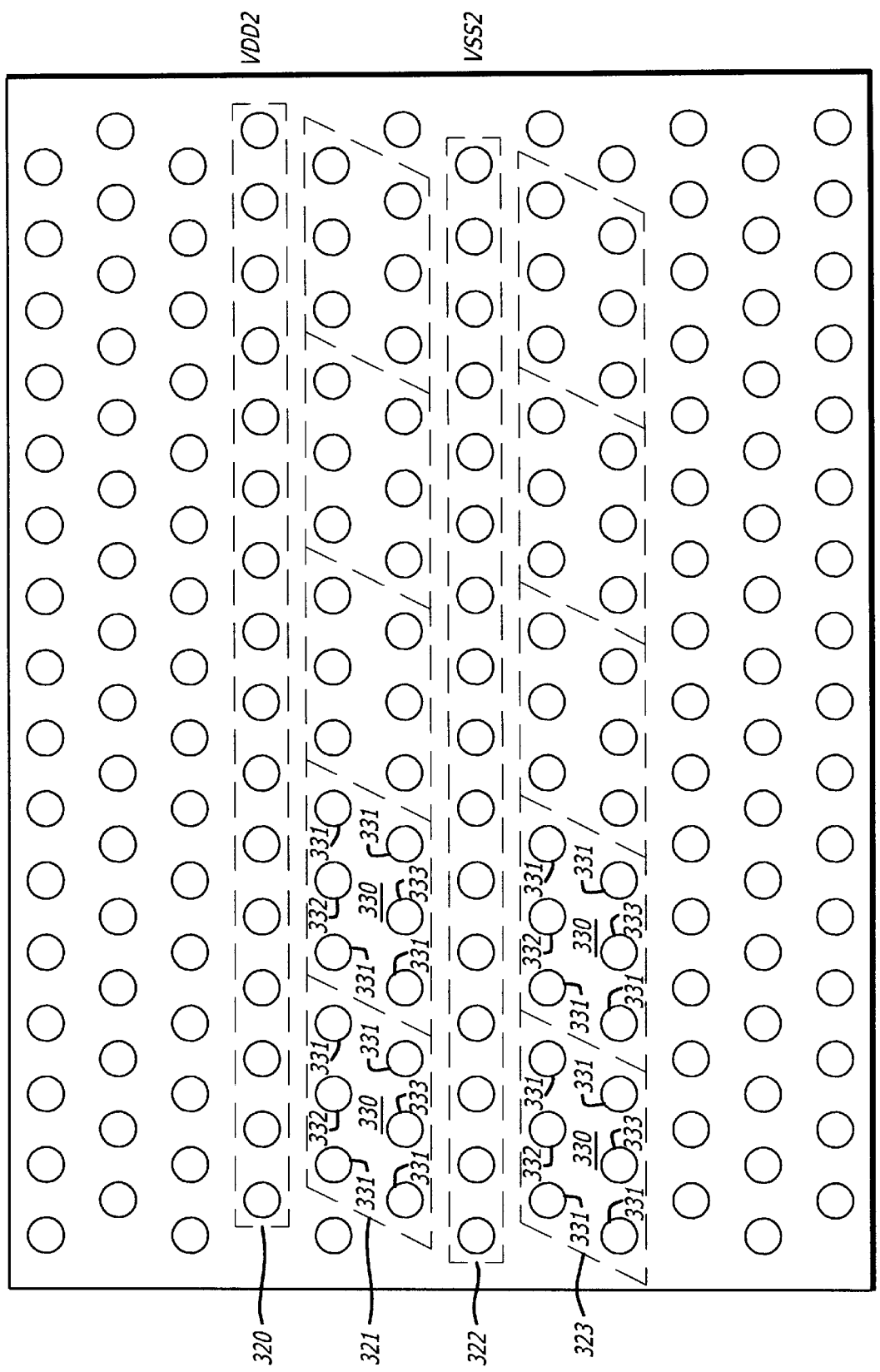
FIG. 12 illustrates a bump pad pattern according to the third embodiment of the invention.

The third embodiment of the invention is identical to the first except that in step 230 (shown in FIG. 8) the user designates the bump pads according to the pattern shown in FIG. 12. The arrangement shown in FIG. 12 is characterized as follows: a row 320 of VDD2 bump pads, followed by a row 321 of horizontally repeating groups 330 of bump pads, followed by a row 322 of VSS2 bump pads, followed by a row 323 of horizontally repeating groups 330 of bump pads. Each group 330 of bump pads is shaped as a parallelogram and includes four I/O bump pads 331, one VDD bump pad 332 and one VSS bump pad 333. Accordingly, an I/O signal:VDD:VSS:VDD2:VSS2 ratio of 8:2:2:3:3 is provided by this arrangement. Although not shown in FIG. 12, it is preferable that the pattern depicted in FIG. 12 repeat vertically.

Similar to the above embodiments, the possible bump pad positions are arranged in a hexagonal array, and preferably, the distance between each bump pad and each of its nearest neighbors is fixed at a constant distance based on the minimum required for fabrication. The bump pads can be oriented in this embodiment so that the repeating parallel rows of VSS2/VDD2 bump pads run parallel to the VSS2/VDD2 rails in a cell-column layout, and bump pads in this embodiment may be de-populated.

Fourth Embodiment

Figure 13:
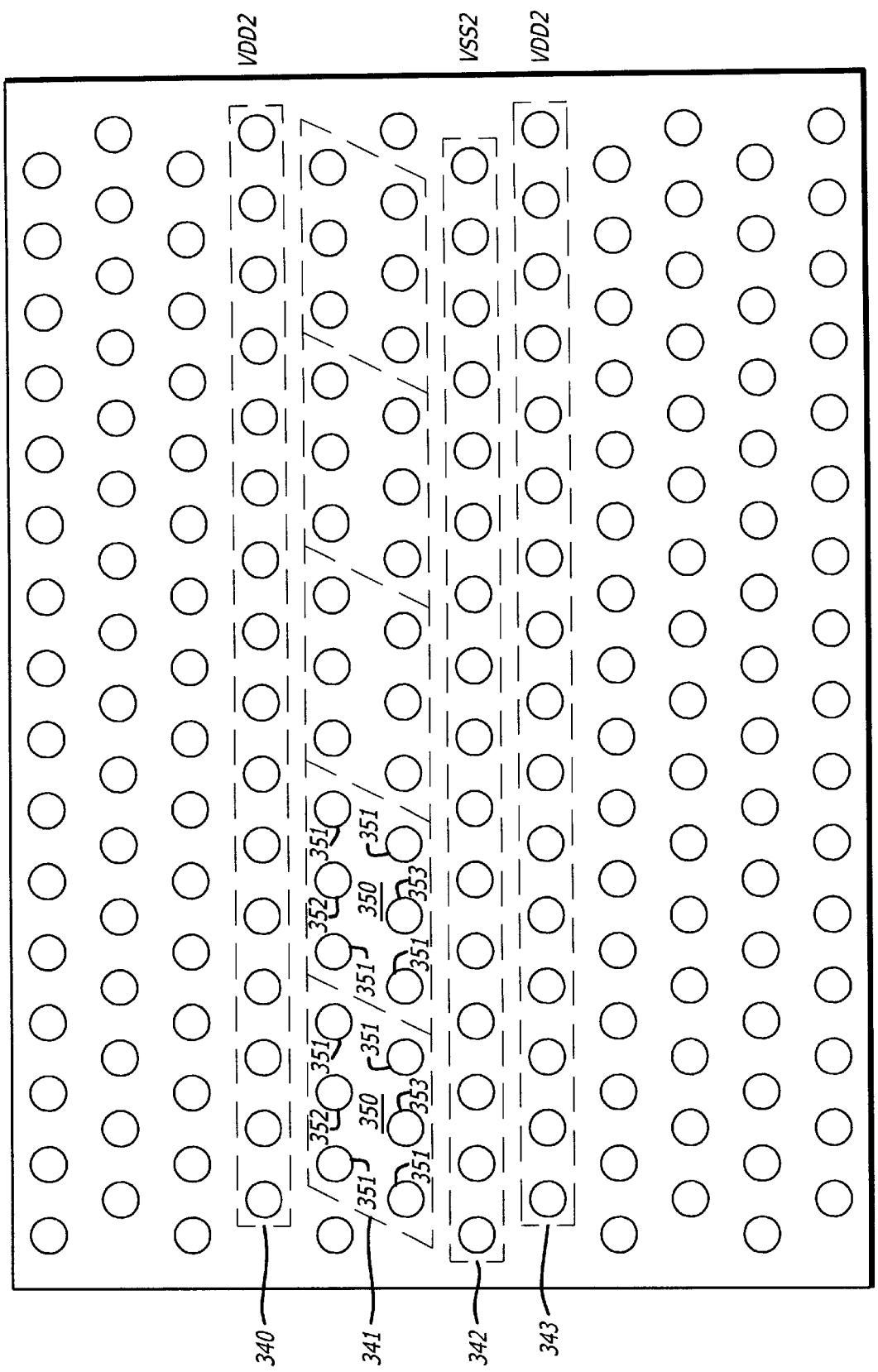
FIG. 13 illustrates a bump pad pattern according to the fourth embodiment of the invention.

The fourth embodiment of the invention is identical to the first except that in step 230 (shown in FIG. 8) the user designates the bump pads according to the pattern shown in FIG. 13. The arrangement shown in FIG. 13 is similar to that of the third embodiment except that an additional row of VDD2 bump pads has been added. Specifically, the arrangement according to this embodiment is characterized as follows: a row 340 of VDD2 bump pads, followed by a row 341 of horizontally repeating groups 350 of bump pads, followed by a row 342 of VSS2 bump pads, followed by a row 343 of VDD2 bump pads. Each group 350 of 30 bump pads is shaped as a parallelogram and includes four I/O bump pads 351, one VDD bump pad 352 and one VSS bump pad 353. Accordingly, an I/O signal:VDD:VSS:VDD2:VSS2 ratio of 4:1:1:2:2 is provided by this arrangement. Although not shown in FIG. 13, it is preferable that the pattern depicted in FIG. 13 repeat vertically.

Similar to the above embodiments, the possible bump pad positions are arranged in a hexagonal array, and preferably, the distance between each bump pad and each of its nearest neighbors is fixed at a constant distance based on the minimum required for fabrication. The bump pads can be oriented in this embodiment so that the repeating parallel rows of VSS2/VDD2 bump pads run parallel to the VSS2/VDD2 rails in a cell-column layout, and bump pads in this embodiment also may be de-populated.

Fifth Embodiment

Figure 14:
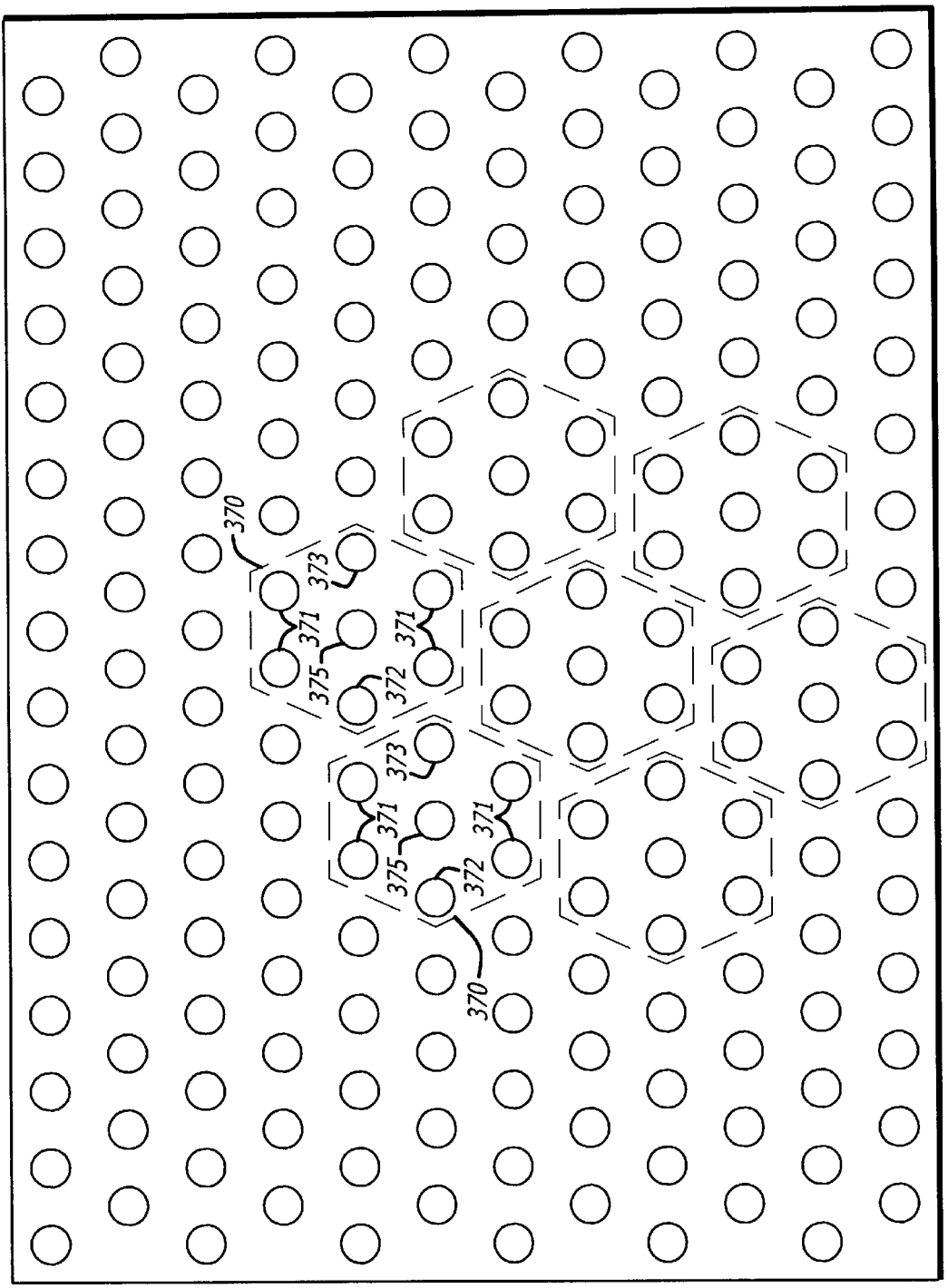
FIG. 14 illustrates a bump pad pattern according to the fifth embodiment of the invention.

The fifth embodiment of the invention is identical to the first except that in step 230 (shown in FIG. 8) the user designates the bump pads according to the pattern shown in FIG. 14. The arrangement shown in FIG. 14 is characterized as a number of contiguous groups 370 of bump pads. Each group 370 of bump pads is shaped as a hexagon and includes four I/O bump pads 371, one VDD bump pad 372, one VSS bump pad 373, and either one VDD2 bump pad 374 or one VSS2 bump pad 375. Accordingly, an I/O signal:VDD:VSS:VDD2:VSS2 ratio of 8:2:2:1:1 is provided by this arrangement. It is preferable that the pattern depicted in FIG. 14 repeat vertically across the surface of the die, although repetition over a smaller area is also possible.

Similar to the above embodiments, the possible bump pad positions are arranged in a hexagonal array, and preferably, the distance between each bump pad and each of its nearest neighbors is fixed at a constant distance based on the minimum required for fabrication. It is noted that bump pads in this embodiment also may be de-populated.

Fabrication

Upon completion of design, as in any of the embodiments described above, the integrated circuit can be fabricated using the masks generated in step 218, but otherwise employing conventional fabrication techniques. During fabrication, the masks generated in step 218 are used to pattern a silicon wafer using a sequence of photolithographic steps. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

The above-mentioned "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation typically involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping generally is achieved with thermal diffusion (wafer is heated and exposed to the desired dopant) and ion implantation (dopant atoms are ionized, accelerated to high velocities and implanted into the wafer surface).

Design System Environment

Figure 15:
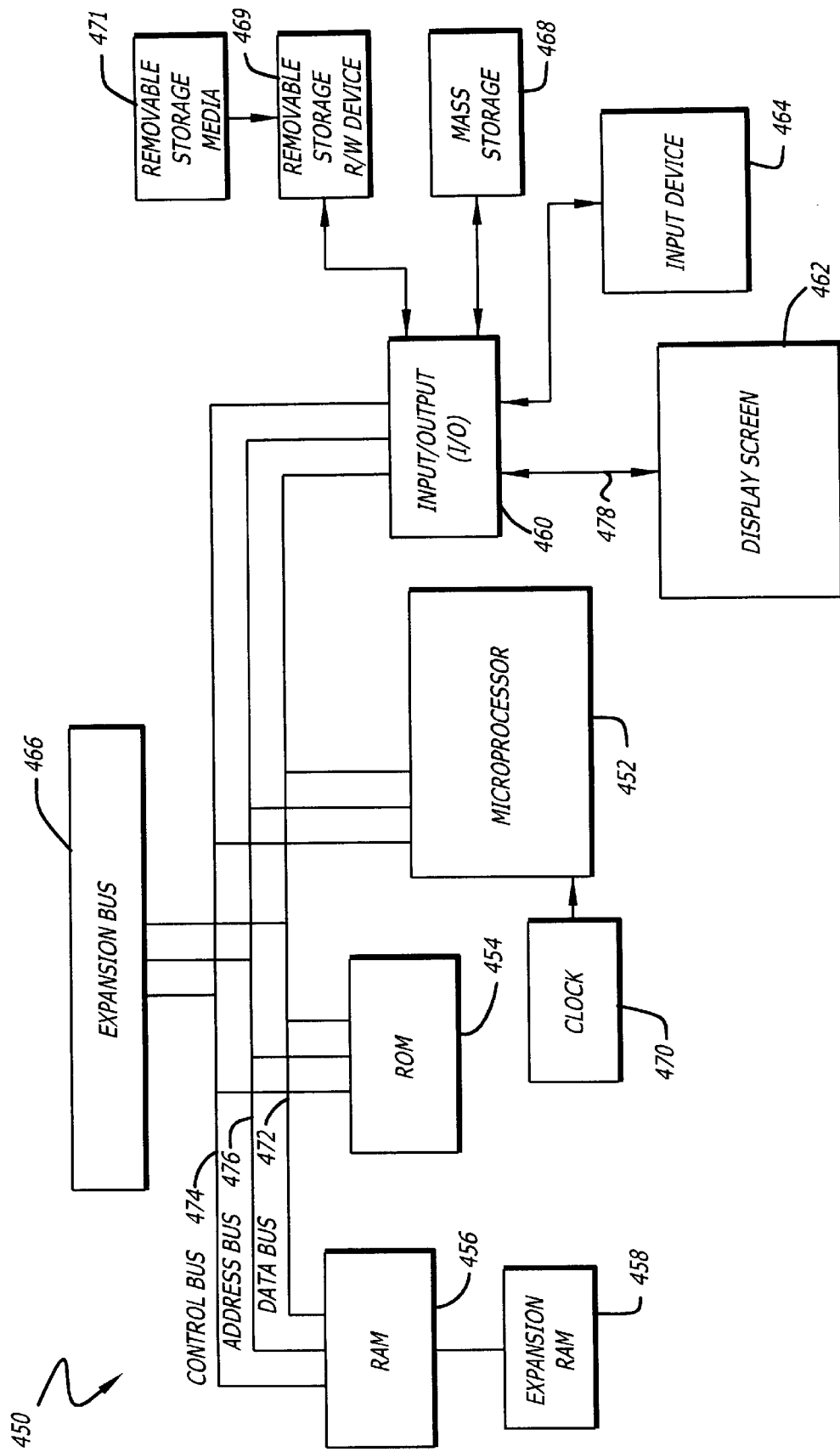
FIG. 15 is a block diagram of a general purpose computer system, representing one suitable computer platform for implementing the methods of the invention.

Generally, the methods described herein with respect to IC design will be practiced with a general purpose computer, either with a single processor or multiple processors. FIG. 15 is block diagram of a general purpose computer system, representing one of many suitable computer platforms for implementing the methods described above. FIG. 15 shows a general purpose computer system 450 in accordance with the present invention. As shown in FIG. 15, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Conclusion

The foregoing embodiments utilize a non-rectangular arrangement of bump pads, even though layout and routing remains rectangular-based. In the foregoing embodiments, it is preferable to lay out a majority of the bump pads in a non-rectangular arrangement, such as a hexagonal array. In this manner, the number of bump pads generally can be increased while still maintaining the advantages of rectangular-based layout and routing.

Although the present invention has been described in detail with regard to the exemplary embodiments and drawings thereof, it should be apparent to those skilled in the art that various adaptations and modifications of the present invention may be accomplished without departing from the spirit and the scope of the invention. For instance, the orientation of the hexagonal array in any of the above embodiments may be rotated 900 so that rows and columns are interchanged in these embodiments. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶ 6.

What is claimed is:

1. A flip-chip integrated circuit die comprising:
   a semiconductor substrate;
   electronic components implemented on said semiconductor substrate;
   plural metal layers;
   wires routed between said electronic components on said metal layers;
   a top layer; and
   plural bump pads arranged in a hexagonal array on said top layer,
   wherein component layout on said semiconductor substrate and wire routing on said metal layers are rectangular-based.

2. A flip-chip integrated circuit die according to claim 1, wherein substantially all wiring is routed horizontally and vertically on said metal layers.

3. A flip-chip integrated circuit die according to claim 1, wherein in a first of the plural metal layers substantially all wire traces are routed vertically and in a second of the plural metal layers substantially all wire traces are routed horizontally.

4. A flip-chip integrated circuit die according to claim 1, wherein center-to-center spacing between any two nearest neighbor bump pads is a same constant distance.

5. A flip-chip integrated circuit die comprising:
   a semiconductor substrate;
   electronic components implemented on said semiconductor substrate;
   plural metal layers;
   wires routed between said electronic components on said metal layers;
   a top layer; and
   plural bump pads arranged in a hexagonal array on said top layer,
   wherein each of plural parallel horizontal lines of bump pads only supplies one of core logic power and core logic ground.

6. A flip-chip integrated circuit die comprising:
   a semiconductor substrate;
   electronic components implemented on said semiconductor substrate;
   plural metal layers;
   wires routed between said electronic components on said metal layers;
   a top layer; and
   plural bump pads arranged in a hexagonal array on said top layer,
   wherein each of plural parallel vertical lines of bump pads only supplies one of core logic power and core logic ground.

7. A flip-chip integrated circuit die comprising:
   a semiconductor substrate;
   electronic components implemented on said semiconductor substrate;
   plural metal layers;
   wires routed between said electronic components on said metal layers;
   a top layer; and
   plural bump pads arranged in a hexagonal array on said top layer,
   wherein said bump pads are arranged in a repeating geometrical pattern of identically shaped groups, each identically shaped group including a predetermined same number of I/O signal bump pads, an I/O power bump pad and an I/O ground bump pad.

8. A flip-chip integrated circuit die according to claim 7, wherein the identically shaped groups are shaped as a parallelogram.

9. A flip-chip integrated circuit die according to claim 7, wherein each of the I/O signal bump pads is located in a same position in each identically shaped group.

10. A flip-chip integrated circuit die according to claim 7, wherein a row of the identically shaped groups is bordered by a row of internal logic power bump pads and a row of internal logic ground bump pads.

11. A flip-chip integrated circuit die according to claim 7, wherein each identically shaped group includes four I/O signal bump pads, one I/O power bump pad and one I/O ground bump pad.

12. A flip-chip integrated circuit die according to claim 7, wherein the identically shaped groups are shaped as a hexagon.

13. A flip-chip integrated circuit die according to claim 12, wherein each of the identically shaped groups also includes an internal logic power bump pad and an internal logic ground bump pad.

14. A flip-chip integrated circuit die according to claim 13, wherein each of the I/O signal bump pads is located in a same position in each identically shaped group.

15. A flip-chip integrated circuit die comprising:
    a semiconductor substrate;
    electronic components implemented on said semiconductor substrate using rectangular-based layout;
    plural metal layers;
    wires routed between said electronic components on said metal layers using rectangular-based routing;
    a top layer; and
    plural bump pads arranged in a hexagonal array on said top layer,
    wherein said bump pads are arranged in a repeating geometrical pattern of identically shaped groups, each identically shaped group including a predetermined same number of I/O signal bump pads, an I/O power bump pad and an I/O ground bump pad.

16. A flip-chip integrated circuit die according to claim 15, wherein a row of the identically shaped groups is bordered by a row of internal logic power bump pads and a row of internal logic ground bump pads.

* * * * *